(12) United States Patent
Sato et al.

(10) Patent No.: US 8,199,191 B2
(45) Date of Patent: Jun. 12, 2012

(54) ELECTRON MICROSCOPE FOR INSPECTING DIMENSION AND SHAPE OF A PATTERN FORMED ON A WAFER

(75) Inventors: Hidetoshi Sato, Hitachinaka (JP); Takumichi Sutani, Hitachinaka (JP); Yutaka Hojo, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1475 days.

(21) Appl. No.: 11/699,062

(22) Filed: Jan. 29, 2007

(65) Prior Publication Data
US 2008/0024601 A1    Jan. 31, 2008

(30) Foreign Application Priority Data
Feb. 16, 2006   (JP) ................................. 2006-039455

(51) Int. Cl.
*H04N 7/18* (2006.01)
*G02B 21/00* (2006.01)
*G06K 9/00* (2006.01)
(52) U.S. Cl. ........................... 348/80; 359/368; 382/145
(58) Field of Classification Search .............. 348/79–80; 382/145; 359/368
See application file for complete search history.

(56) References Cited

U.S. PATENT DOCUMENTS

| | | | | |
|---|---|---|---|---|
| 5,793,969 A | * | 8/1998 | Kamentsky et al. ........... | 709/213 |
| 5,838,492 A | * | 11/1998 | Katsunuma et al. ........... | 359/426 |
| 6,078,738 A | * | 6/2000 | Garza et al. ................... | 716/139 |
| 6,091,845 A | * | 7/2000 | Pierrat et al. .................. | 382/144 |
| 6,744,266 B2 | * | 6/2004 | Dor et al. .................. | 324/754.22 |
| 6,782,525 B2 | * | 8/2004 | Garza et al. ..................... | 716/52 |
| 6,952,818 B2 | * | 10/2005 | Ikeuchi .......................... | 430/311 |
| 7,003,755 B2 | * | 2/2006 | Pang et al. ....................... | 716/52 |
| 7,260,813 B2 | * | 8/2007 | Du et al. ......................... | 716/51 |
| 7,379,175 B1 | * | 5/2008 | Stokowski et al. ......... | 356/237.5 |
| 7,408,154 B2 | * | 8/2008 | Oosaki et al. ................. | 250/307 |
| 7,415,150 B2 | * | 8/2008 | Maali ............................ | 382/151 |

(Continued)

FOREIGN PATENT DOCUMENTS
JP    11-067136    3/1999
(Continued)

OTHER PUBLICATIONS

Japanese Office Action, with partial English Translation, issued in Japanese Patent Application No. 2006-039455, mailed Mar. 22, 2011.

*Primary Examiner* — George C Neurauter
(74) *Attorney, Agent, or Firm* — McDermott Will & Emery LLP

(57) ABSTRACT

There is provided an electron microscope which is capable of making a significant contribution to accomplishment of efficiency in investigating causes for pattern abnormalities found out. The electron microscope including an I/O for capturing image data on a microscopic image acquired by another electron microscope, a computation processing unit for generating a display signal based on the image data on the microscopic image acquired by another electron microscope and captured via the I/O and image data on a microscopic image acquired by the electron microscope itself, in order that the microscopic image acquired by another electron microscope and the microscopic image acquired by the electron microscope itself are displayed at the same scale and under the same display condition, and a display unit for displaying both of the microscopic images based on the display signal from the computation processing unit.

6 Claims, 5 Drawing Sheets

U.S. PATENT DOCUMENTS

| | | | |
|---|---|---|---|
| 7,434,197 B1 * | 10/2008 | Dolainsky et al. | 716/53 |
| 7,476,857 B2 * | 1/2009 | Oosaki et al. | 250/310 |
| 7,681,159 B2 * | 3/2010 | Matsuoka et al. | 716/113 |
| 2002/0019729 A1 * | 2/2002 | Chang et al. | 703/6 |
| 2006/0088200 A1 * | 4/2006 | Du et al. | 382/144 |
| 2006/0108524 A1 | 5/2006 | Nagatomo et al. | |
| 2006/0245636 A1 | 11/2006 | Kitamura et al. | |
| 2010/0245557 A1 * | 9/2010 | Luley et al. | 348/79 |

FOREIGN PATENT DOCUMENTS

| | | |
|---|---|---|
| JP | 2003-188074 A | 7/2003 |
| JP | 2005156606 A * | 6/2005 |

* cited by examiner

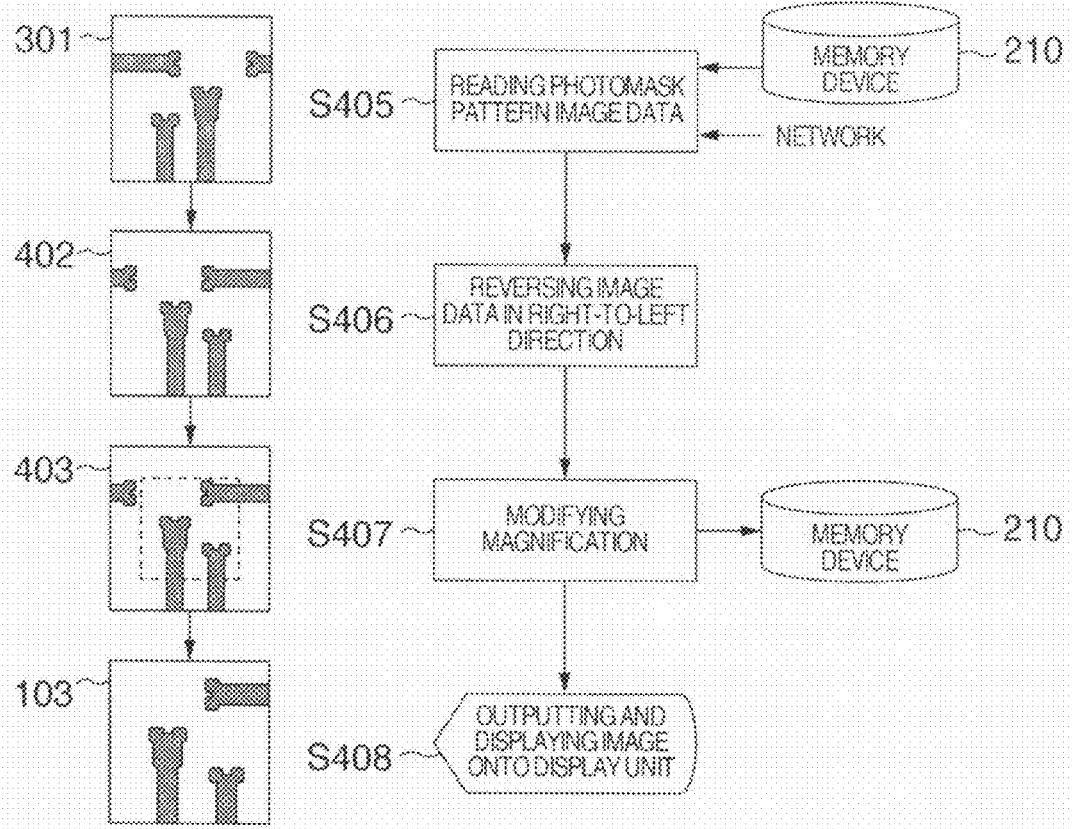
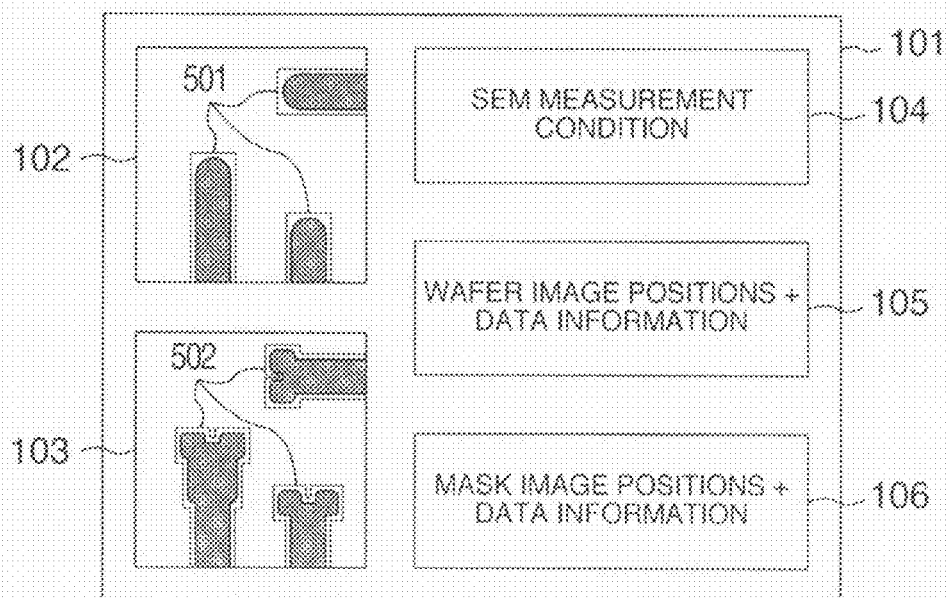

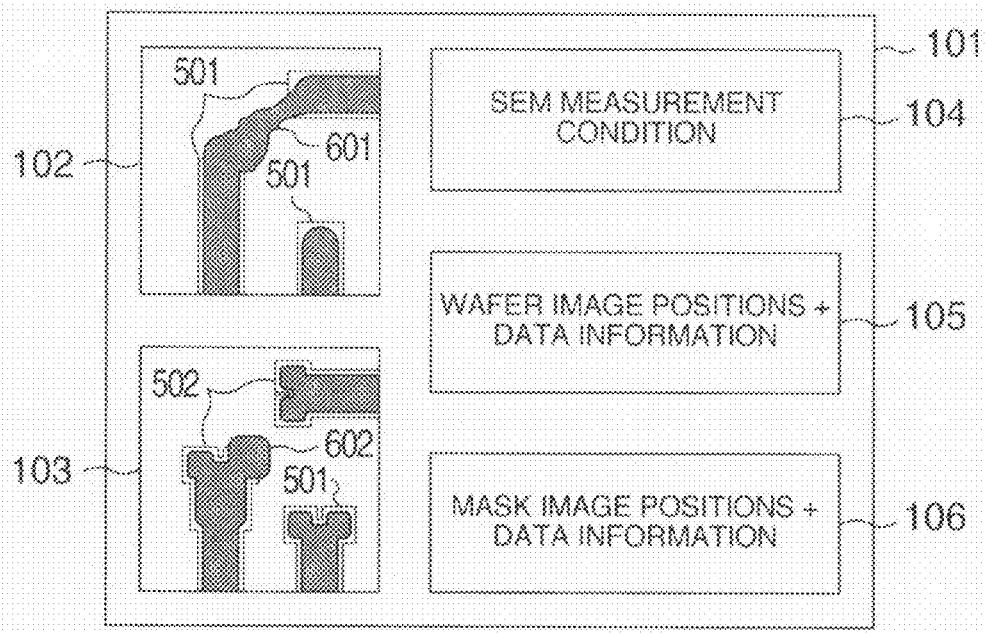

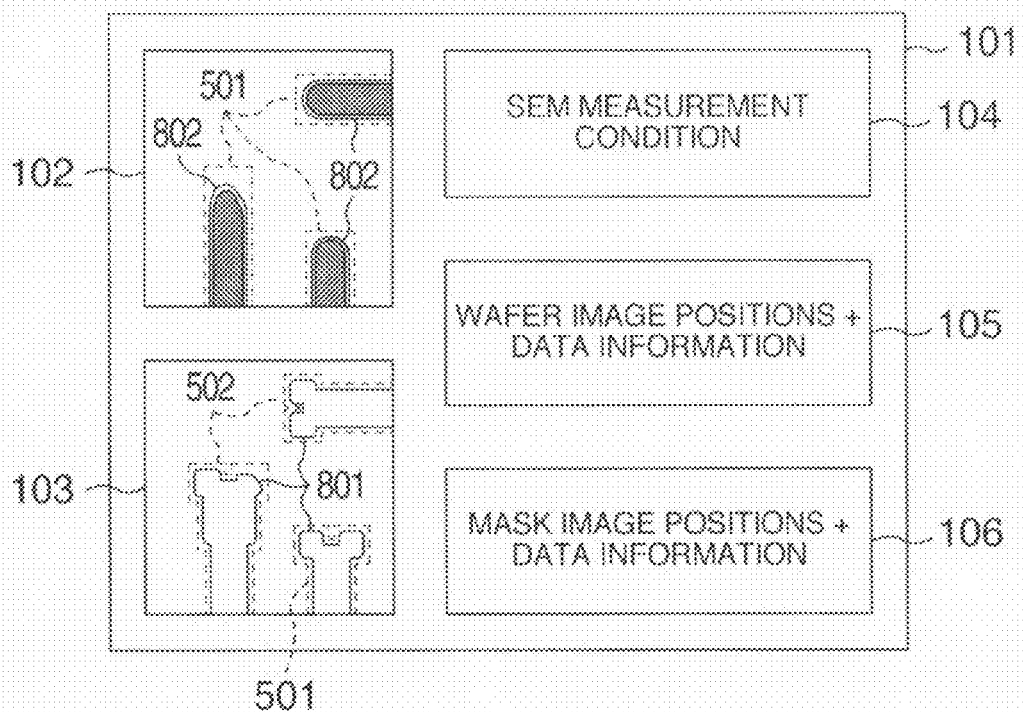

ELECTRON MICROSCOPE FOR INSPECTING DIMENSION AND SHAPE OF A PATTERN FORMED ON A WAFER

BACKGROUND OF THE INVENTION

The present invention relates to an electron microscope for inspecting dimension and shape of a pattern formed on a wafer.

The shape and dimension of a pattern formed on a wafer and those of a photomask pattern are measured and evaluated using an evaluation tool so as to judge the pass/fail. In the measurement of a critical dimension (which, hereinafter, will be referred to as "CD") in particular, a scanning electron microscope (hereinafter, referred to as "SEM") equipped with a length-measuring function is generally used.

Also, in accompaniment with microminiaturization and complication of semiconductor integrated circuits in recent years, an optical proximity correction (hereinafter, referred to as "OPC") has been getting more and more applied to a photomask pattern. Here, the photomask pattern is used when the pattern of a semiconductor integrated circuit is transferred onto a wafer by a microlithography tool. With respect to the pattern transferred onto the wafer by using the OPC-equipped photomask like this, the length-measuring SEM is requested to exhibit an enough resolving power appropriate thereto. Simultaneously, in some cases, it is requested to measure the CD at a larger number of points.

In association with the measurement at a large number of points like this, a lot of proposals have been made concerning technologies for enhancing inspection efficiency by the length-measuring SEM by using CAD (computer aided design) data for determination of the measurement positions and measurement condition of the pattern. For example, as disclosed in JP-A-2003-188074 and the like, pattern image data on the wafer obtained by the length-measuring SEM is compared with the CAD data at the time of pattern design, then displaying differences in dimension and shape therebetween.

In the pattern formation of a semiconductor integrated circuit, it is requested to form the design pattern on the wafer with a desired dimension accuracy. Ensuring the desired dimension accuracy of the pattern on the wafer, however, is becoming increasingly difficult because of the following various causes: Complication of the photomask pattern in accompaniment with the OPC, dimension accuracy of the photomask, and further, stability of the fabrication process. Moreover, the difficulty in the pattern formation has become even more serious because of an increase in pattern data capacity due to the microminiaturization.

On account of this, in order to enhance a reliability in the pattern formation, in addition to the measurement of a representative pattern on the wafer made earlier, there exists a necessity for evaluating and managing the CD such that a full coverage will be made regarding points which are highly likely to give rise to a problem in the pattern dimension from the side of the OPC. However, even if abnormalities of the CD or shape in the pattern have been found out in this way, events which are conceivable as causes for the abnormalities cover a fairly broad range, such as inappropriateness of the OPC, the CD or shape of the photomask, and the fabrication process. Consequently, a task for investigating the complicated causes necessitates tremendous amount of time and labor.

SUMMARY OF THE INVENTION

The present invention has been devised in view of the above-described situation. Accordingly, an object of the present invention is to provide an electron microscope which is capable of making a significant contribution to accomplishment of efficiency in investigating causes for pattern abnormalities found out.

(1) In order to accomplish the above-described object, in the present invention, there is provided an electron microscope including an input unit for capturing image data on a microscopic image acquired by another electron microscope, a computation processing unit for generating a display signal based on the image data on the microscopic image acquired by another electron microscope and captured via the input unit and image data on a microscopic image acquired by the electron microscope itself, in order that the microscopic image acquired by another electron microscope and the microscopic image acquired by the electron microscope itself are displayed at the same scale and under the same display condition, and a display unit for displaying both of the microscopic images based on the display signal from the computation processing unit.

(2) In order to accomplish the above-described object, in the present invention, there is also provided an electron microscope including an input unit for capturing image data on a microscopic image acquired by another electron microscope, a memory unit for memorizing the image data on the microscopic image acquired by another electron microscope and captured via the input unit, a computation processing unit for manipulating the image data on the microscopic image by executing at least an image-display-magnification modifying step and an image reversing step, the microscopic image being acquired by another electron microscope and memorized into the memory unit, in order that display condition of the microscopic image acquired by another electron microscope and display condition of a microscopic image acquired by the electron microscope itself are caused to coincide with each other, and generating a display signal based on the image data on the microscopic image manipulated by the computation processing unit and image data on the microscopic image acquired by the electron microscope itself, and a display unit for displaying, based on the display signal from the computation processing unit, the microscopic image manipulated by the computation processing unit and the microscopic image acquired by the electron microscope itself.

(3) In the above-described description (1), preferably, the computation processing unit executes an image-display-magnification modifying step, an image reversing step, and an image-rotation correcting step to at least either of both of the microscopic images in order that display conditions of both of the microscopic images are caused to coincide with each other.

(4) In any one of the above-described descriptions (1) to (3), preferably, the microscopic image acquired by another electron microscope is pattern image of a photomask, the microscopic image acquired by the electron microscope itself being pattern image on a wafer formed using the photomask.

(5) In the above-described description (4), preferably, the computation processing unit reduces the pattern image of the photomask based on a transfer magnification at the time when the pattern image on the wafer is formed using the photomask.

(6) In the above-described description (4) or (5), preferably, the computation processing unit manipulates CAD data on the pattern image of the photomask, and causes the display unit to display a pattern outer-shape corresponding to the pattern image of the photomask such that the pattern outer-shape is superposed on the pattern image on the wafer.

(7) In any one of the above-described descriptions (1) to (6), preferably, the image data on the microscopic image acquired by another electron microscope and the image data on the microscopic image acquired by the electron microscope itself are managed in a manner of being made related with each other.

(8) In any one of the above-described descriptions (4) to (7), preferably, the computation processing unit causes the display unit to display a simulation result such that the simulation result is superposed on the pattern image on the wafer, the simulation result being based on the pattern image of the photomask of a pattern shape which will be formed on the wafer when the photomask is used.

(9) In order to accomplish the above-described object, in the present invention, there is also provided an electron microscope including a memory unit for memorizing image data on a microscopic image acquired by the electron microscope itself in advance, a computation processing unit for generating a display signal based on the image data on the microscopic image acquired by the electron microscope itself in advance and image data on a microscopic image acquired by the electron microscope itself after that, both of the microscopic images being acquired by the electron microscope itself in the separate manner, in order that the microscopic image acquired by the electron microscope itself in advance and memorized into the memory unit and the microscopic image acquired by the electron microscope itself after that are displayed at the same scale and under the same display condition, and a display unit for displaying both of the microscopic images based on the display signal from the computation processing unit.

According to the present invention, it becomes possible to easily make a comparison and contrast between the microscopic image of pattern of a photomask and the microscopic image of pattern on a wafer transferred using the pattern of the photomask. This feature makes it possible to judge, at the time of the measurement, which of formation of the photomask and fabrication process of the photomask the occurrence causes for found-out pattern abnormalities on the wafer exist in. This allows implementation of a significant contribution to accomplishment of efficiency in investigating the occurrence causes for the found-out pattern abnormalities.

The other objects, features, and advantages of the present invention will become apparent from description of the following embodiments of the present invention together with the accompanying drawings.

BRIEF DESCRIPTION OF THE DRAWINGS

FIG. 5 is a flowchart for illustrating a manipulation processing step of manipulating the photomask pattern image by using the control computer set up in the electron microscope according to the first embodiment of the present invention, together with photomask pattern images in the processes;

FIG. 6 is a diagram for illustrating an example of the display screen of an electron microscope according to a second embodiment of the present invention;

FIG. 7 is a diagram for exemplifying a state where the pattern on a wafer whose abnormality has been found out is displayed in the example of the display screen of the electron microscope according to the second embodiment of the present invention;

FIG. 8 is a diagram for illustrating an example of management data on photomasks used in an electron microscope according to a third embodiment of the present invention; and FIG. 9 is a diagram for illustrating an example of the display screen of an electron microscope according to a fourth embodiment of the present invention.

DESCRIPTION OF THE INVENTION

Figure 1:
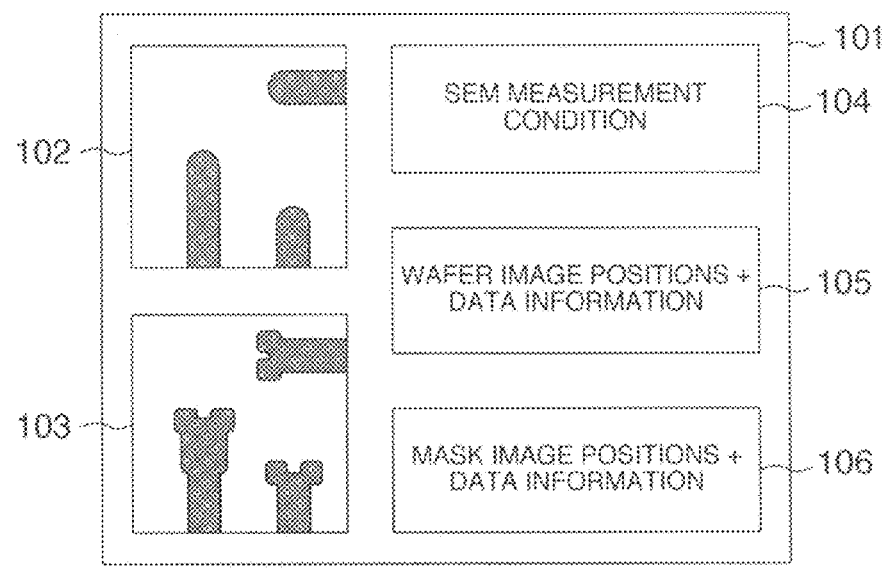
FIG. 1 is a diagram for illustrating an example of the display screen of an electron microscope according to a first embodiment of the present invention.

Prior to the explanation of embodiments of the present invention, the brief explanation will be given below concerning background of the present invention.

In the fabrication of a semiconductor integrated circuit, a pattern which becomes necessary is designed on the circuit by CAD. Then, a pattern based on the CAD data is formed on surface of a wafer. Usually, when transferring the pattern on the wafer, photolithography technology is applied where a microlithography tool referred to as "stepper" or "scanner" is used. In the operation of the microlithography tool, first, light from a light source is illuminated onto a photomask (called "reticle" in some cases). Next, the light which has passed through the photomask is reduced by a lens. Finally, the reduced light is projected and image-formed onto a thin film existing on the wafer (silicon wafer) and composed of a photosensitive resin (photoresist).

The photomask is a thin film formed on a quartz substrate based on the CAD data and composed of a material such as chromium or molybdenum silicide. The photomask is finally formed as a light shielding film by patternizing the thin film by applying thereto a processing performed using an electron beam exposure tool or laser exposure tool. Since the reduction ratio of the microlithography tool is generally equal to about 1/fourth to 1/fifth, it turns out that the pattern of the photomask becomes a one obtained by magnifying the pattern formed on the wafer by about four to five times.

At the fabrication step of fabricating this photomask, when drawing the pattern of the photomask on the photoresist on the quartz substrate by using the electron beam exposure tool or laser exposure tool, mask data is used where the CAD data on the semiconductor pattern to be formed on the wafer is magnified. After drawing the pattern of the photomask on the photoresist on the basis of the mask data, a light shielding layer is formed via a development step and an etching step. Moreover, the photomask is completed via an inspection step.

Here, in accompaniment with the microminiaturization of semiconductor integrated circuits in recent years, line width of the pattern of the photomask, together with line width of the pattern to be formed on the wafer, has been becoming drastically smaller and smaller. A semiconductor integrated circuit whose line width is equal to about 65 nm has been made commercially available recently. In this case, if the reduction ratio of the microlithography tool is equal to 1/fourth, line width of about 260 nm exists in the pattern of the photomask.

Also, in recent years, in the micro-lithography tool, the OPC technology and phase-shift mask technology have been frequently used in order to resolve a pattern which is smaller than wavelength of the light. In a microminiaturized pattern, when the light which has passed through the photomask pattern is reduced via the lens and projected onto the wafer to be exposed thereto, the light has an intensity distribution by being influenced by such phenomena as diffraction and aberration. As a result, the pattern becomes difficult to resolve exactly as is indicated in the photomask pattern. In the OPC technology, in order to correct this drawback, the intensity distribution of the light which has passed through the photomask pattern and is reduced and projected onto the wafer is calculated or analyzed into a rule. Based thereon, while taking the optical proximity effect (OPE) into consideration, shape of the photomask pattern is manipulated, e.g., the photomask pattern data is modified. This processing makes the OPC technology an effective method by which the shape and dimension of the pattern to be formed on the wafer are made to come nearer to the design data. In general, the photomask pattern which is modified using the OPC technology is referred to as "OPC pattern".

Namely, because of the OPC, the photomask pattern data becomes complicated. In addition, the pattern on the wafer is formed with the light intensity distribution resulting from the OPC pattern. As a result, accuracy of formation (dimension or shape) of the photomask pattern exerts a tremendous influence on shape and dimension of the pattern on the wafer. For example, dimension accuracy (tolerance value) of the photomask used in a 65-nm node LSI becomes equal to 5 nm or less. This is substantially the same level as that of dimension accuracy of the pattern reduced, projected, and exposed-onto the wafer. Furthermore, in addition to microminiaturization of the pattern, the OPC-pattern implementation brings about a skyrocketing increase in data capacity of the photomask pattern. At present, it is not unusual that the data capacity exceeds a few hundreds of GB.

In general, devices such as a SEM equipped with a length-measuring function are generally used for the pass/fail judgment on the shape and dimension of the on-wafer pattern or the photomask pattern. In accompaniment with the microminiaturization of the pattern of a semiconductor integrated circuit, however, when the wafer on which the OPC-equipped pattern is transferred is selected as the measurement target, the length-measuring SEM is requested to exhibit an enough resolving power appropriate thereto. Simultaneously, in some cases, it is requested to make the CD measurement at all of points (e.g., a few hundreds of points or more) which are highly likely to give rise to a problem in the pattern dimension from the side of the OPC.

In the measurement at a large number of points like this, in some cases, measurement efficiency by the length-measuring SEM can be enhanced by determining hot spots (which will be described later) in advance by using the CAD data at the time of pattern layout design for determination of the measurement positions and measurement condition of the pattern. However, even if CD abnormalities or shape abnormalities have been found out on the pattern on the wafer, due to the microminiaturization and complication of the photomask pattern, it is becoming increasingly difficult to immediately judge which of inappropriateness of the OPC, the CD or shape of the photomask pattern, and the wafer fabrication process the causes for the abnormalities exist in. On account of this, cutting off the problem into elements is also becoming increasingly difficult, such as whether or not the abnormalities found out can be solved merely by changing condition of the fabrication process, and whether or not the photomask itself needs to be re-fabricated.

Concretely, the CD measurement points on the photomask pattern are determined at the time of the pattern data creation, or when the OPC pattern data is added to original data of this photomask pattern. In particular, verification of the entire pattern is carried out in order to confirm whether or not the OPC pattern added to the original data of the photomask pattern has given rise to a new problem. Taking the OPC into consideration in this way, locations on the wafer at which resolving the pattern is severe and difficult are found out. These locations at which resolving the pattern is severe and difficult are referred to as "the hot spots".

Furthermore, the pattern to be formed on the wafer is exposed on each photomask-pattern area basis and based on the step-and-scan scheme. Here, a plurality of photomask patterns of the same semiconductor chip are located on the photomask. Usually, these photomask patterns are exposed simultaneously. On account of this, even if, with the CAD data selected as the criterion, a comparison and checking is made between the CD or shape of the on-wafer pattern and the CD or shape of the photomask pattern used for the exposure of the on-wafer pattern, it is not easy at all to judge where the occurrence causes for the abnormalities exist. Consequently, the task for investigating the causes has necessitated tremendous amount of time and labor.

In view of this situation, referring to the drawings, the explanation will be given below concerning an electron microscope according to a first embodiment of the present invention.

The present embodiment relates to an electron microscope capable of making the comparison and inspection between the dimension and shape of a photomask pattern for fabricating a semiconductor integrated circuit and the dimension and shape of an on-wafer pattern reduced, projected, and exposed onto a wafer by using the photomask pattern.

Incidentally, in the present embodiment, the explanation will be given citing, as an example, a case where the present invention is applied to the scanning electron microscope (SEM) equipped with a length-measuring function for measuring the dimension and shape of the on-wafer pattern or the photomask pattern.

(1st Embodiment)

In the present embodiment, the display and comparison are performed between a microscopic image of pattern formed on a wafer by using a photomask and a microscopic image of pattern of the photomask on a quartz substrate, i.e., the original version of the pattern formed on the wafer.

FIG. 1 is a diagram for illustrating an example of the display screen of the electron microscope according to the first embodiment of the present invention.

In FIG. 1, within the display screen 101 of a display device 110 (refer to FIG. 2) including, e.g., CRT or LCD, layout is performed with respect to the following display areas each: In an upper-left area of the screen, a display area of a microscopic image (hereinafter, referred to as "image 102") of pattern formed on a wafer acquired by the electron microscope according to the present embodiment, and, in a lower-left area of the screen, a display area of a microscopic image (hereinafter, referred to as "image 103") of pattern of a photomask used when the pattern of the image 102 is transferred onto the wafer, and acquired by another electron microscope. In the present embodiment, it is assumed that the image 103 is the microscopic image acquired by another electron microscope (SEM or the like) existing differently from the electron microscope according to the present embodiment.

Incidentally, as illustrated in the image 103, OPC patterns referred to as "serifs" are added to the pattern of the photomask.

Also, in a right-side area within the display screen 101, the following display areas are arranged from above to below in sequence: A measurement-condition display area 104 for displaying a measurement condition of an electron microscope, an on-wafer pattern data display area 105 for displaying position of the image 102 on the wafer and each type of data information on the on-wafer pattern, and a photomask-pattern data display area 106 for displaying position of the image 103 on the photomask and each type of data information on the photomask pattern.

Incidentally, the layout of each display area within the display screen 101 is not limited to the mode in FIG. 1. It is preferable, however, to arrange the display areas of the images 102 and 103 side by side in the up-and-down or right-to-left direction so that both of them are easy to make the comparison therebetween visually.

Figure 2:
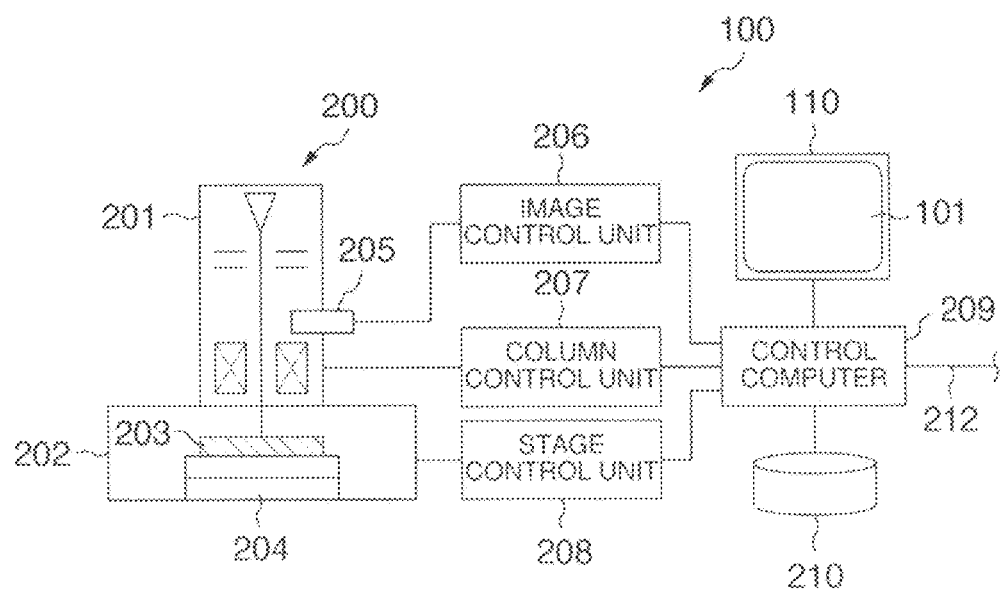
FIG. 2 is a functional block diagram for illustrating the entire configuration of the electron microscope according to the first embodiment of the present invention.

FIG. 2 is a functional block diagram for illustrating the entire configuration of the electron microscope according to the present embodiment.

As illustrated in FIG. 2, the electron microscope 100 according to the present embodiment includes the display device 110 having the above-described display screen 101, an image sensing unit 200 for acquiring the microscopic image 102 of a measurement sample, an image control unit 206 for converting, into image data, a secondary-electron signal generated from the measurement sample in the image sensing unit 200, a column control unit 207 for controlling a deflector of the image sensing unit 200 thereby to control the illumination angle of an electron beam to be illuminated onto the measurement sample, a stage control unit 208 for controlling the displacement of a stage 204 on which the measurement sample is mounted, a control computer 209 for transmitting/receiving signals with these control units 206 to 208, the display device 110, and another electron microscope, and controlling each appliance connected thereto, and a memory device 210 for memorizing each type of data and the like.

The image sensing unit 200 is of a common type as this kind of device. In this image sensing unit 200, the electron beam emitted from an electron gun inside an electron-optics system column 201 is illuminated via a lens/deflection system onto a wafer 203, i.e., the measurement sample located on the stage 204 inside a vacuum sample chamber 202. Then, the secondary electrons generated from the sample by the illumination of the electron beam are detected by a detector 205.

During the illumination of the electron beam, based on an instruction signal from the control computer 209, the stage control unit 208 controls the displacement of the stage 204 thereby to displace the wafer 203 up to a desired pattern position. Simultaneously herewith, the column control unit 207 controls the electron beam by outputting a deflection signal for the electron beam to the deflector inside the column 201 in response to an image magnification. Also, based on the instruction signals to the column control unit 207 and the stage control unit 208 associated with the illumination control over the electron beam to the measurement sample, address information on the image data on each portion of the measurement sample are created. The address information created are memorized into the memory device 210 and the like in a manner of being made related with the image data on the corresponding locations.

Also, the secondary-electron signal outputted from the detector 205 by receiving the secondary electrons is inputted into the image control unit 206. Then, based on the secondary-electron signal, the image control unit 206 creates an image signal for reconstructing the microscopic image of the wafer 203. Moreover, the unit 206 digitizes the created image signal, then outputting the digitized image signal to the control computer 209. The control computer 209 stores the inputted image data signal into the memory device 210 as image data, together with information on the measurement condition (magnification and the like) and measurement positions made related with the image data signal.

Also, consider a case where the control computer 209 is connected to a (wired or wireless) network 212 such as LAN (or the Internet). This connection permits the control computer 209 to transmit/receive data with some other appliance connected to the network 212. In the present embodiment, another electron microscope (not illustrated) is connected thereto via the network 212. This connection permits the control computer 209 to receive, via the network 212, image data signal of the microscopic image acquired by another electron microscope, and information on the measurement condition and measurement positions. The control computer 209 stores the image data signal of the microscopic image, which is acquired by another electron microscope and received thereby via the network 212, into the memory device 210 as image data, together with the information on the measurement condition and measurement positions made related with the image data signal.

Figure 3:
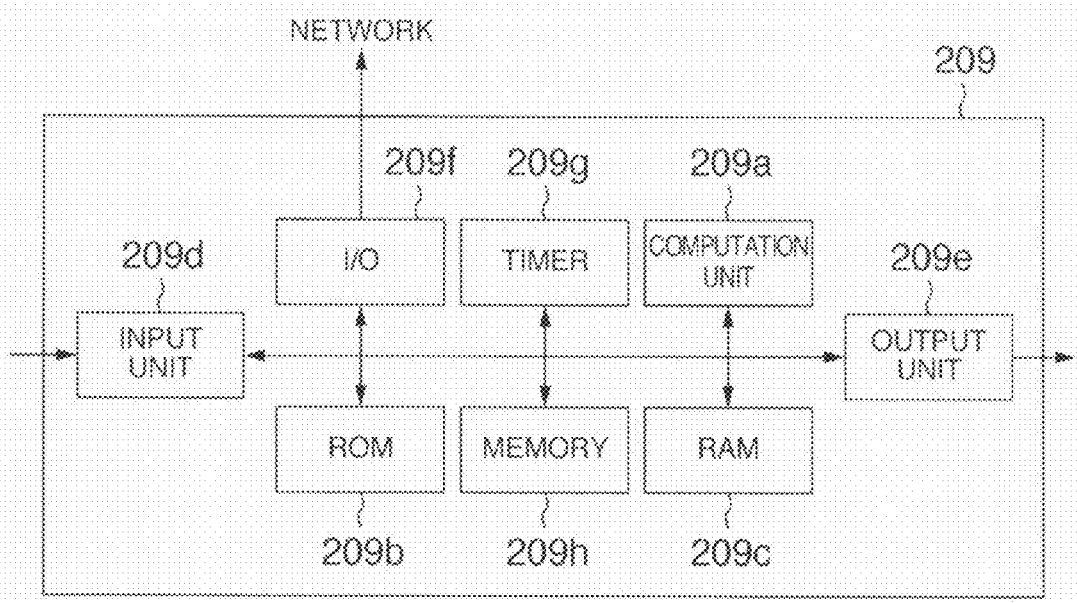
FIG. 3 is a block diagram for illustrating the functional configuration of a control computer set up in the electron microscope according to the first embodiment of the present invention.

FIG. 3 is a block diagram for illustrating the functional configuration of the control computer 209.

As illustrated in FIG. 3, the control computer 209 includes a computation unit 209a for executing each type of computation processing, a ROM 209b for storing in advance such data as a program and constant necessary for each type of computation processing, a RAM 209c capable of memorizing/reading each type of data whenever required, an input unit 209d and output unit 209e for transmitting/receiving signals with such appliances as the respective control units 206 to 208, the memory device 210, and the display device 110, an I/O (interface circuit) 209f for establishing a connection with the network 212 via a not-illustrated terminal, and transmitting/receiving data with external appliances, and a timer 209g for measuring time. Although a reference numeral 209h denotes a memory for memorizing each type of data, the memory 209h is unnecessary if the memory device 210 is effective enough.

In the present embodiment, the image data on the photomask pattern is grabbed into the control computer 209 via the network 212, the I/O 209f, or a storage medium such as removable disc or flexible disc. The image data on the photomask pattern inputted via the I/O 209f is memorized into the memory device 210. Also, the image data on the on-wafer pattern acquired by the present electron microscope itself using the image sensing unit 200 is grabbed into the control computer 209 via the input unit 209d, then being memorized into the memory device 210. Incidentally, although these pieces of image data may also be memorized into the memory 209h instead of (or together with) the memory device 210, it is assumed that they are memorized into the memory device 210 in the present embodiment.

Also, in order that the display condition of the image data on the on-wafer pattern and the display condition of the image data on the photomask pattern memorized into this memory device 210 are caused to coincide with each other, a program for causing the computation unit 209a to execute a processing of manipulating at least either of both of the microscopic images is stored into the ROM 209b.

Here, "the display conditions are caused to coincide with each other" means the following manipulation: Either or both of the microscopic images is or are manipulated in order that the same locations of the microscopic image of the on-wafer pattern and the microscopic image of the photomask pattern are displayed at the same scale and such that directions and rotation angles of the microscopic images are caused to coincide with each other. Namely, based on the image data on the on-wafer pattern, e.g., the on-wafer pattern including hot spots is displayed on the image 102 on the display screen 101. Simultaneously, based on the image data on the photomask pattern, the corresponding locations of the photomask pattern are displayed on the image 103 at the same scale, direction, and angle as those displayed on the image 102. This makes it possible to make a comparison and contrast therebetween at first sight. Incidentally, in the present embodiment, the display conditions of both of the microscopic images are caused to coincide with each other by manipulating the image data on the photomask pattern acquired from outside with the image data on the on-wafer pattern selected as the reference.

The program stored in the ROM 209b and used for causing the computation unit 209a to execute processing steps of causing the display conditions of both of the image data to coincide with each other includes a processing step of modifying the image display magnification of the photomask pattern. At this processing step of modifying the image display magnification, the photomask pattern image is reduction-manipulated based on the transfer magnification (reduction exposure magnification) at the time when the pattern is transferred onto the wafer by using the photomask. Also, although the detailed explanation will be given later, preferably, the program is written in advance such that it also includes a processing step of reversing the photomask pattern image. Moreover, preferably, in order to cause the display conditions of both of the microscopic images to coincide with each other more precisely, the program is written in advance such that it is also capable of executing a processing step of causing display angles of both of the microscopic images to coincide with each other by rotating the photomask pattern image in coincidence with the on-wafer pattern image as required.

Figure 4:
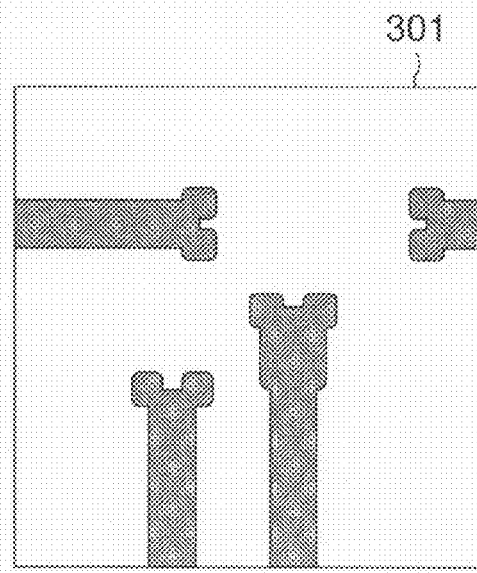
FIG. 4 is a schematic diagram for illustrating a photomask pattern image at the time of the measurement.

Here, as illustrated in FIG. 4, a photomask pattern image 301 acquired by another electron microscope, in its unmanipulated state, differs from the on-wafer pattern image in the direction thereof. The reason for this is that the photomask is located on the semiconductor-lithography-use microlithography tool referred to as "stepper" or "scanner" such that the surface of the photomask on which the pattern is drawn, i.e., the pattern surface of the photomask, is directed downward. If dusts or the like adhere to the pattern surface, bad influences are exerted onto the on-wafer patterns which are fabricated in large quantities using this photomask. Accordingly, usually, the photomask is dealt with such that the pattern surface is directed downward. On account of this, usually, the photomask pattern image and the on-wafer pattern image acquired by the electron microscopes are reversed in the right-to-left or up-and-down direction. Furthermore, the pattern is transferred onto the wafer such that the light which has passed through the photomask pattern is reduced and exposed by the microlithography tool. As a result, if the photomask pattern image and the on-wafer pattern image are acquired under the same condition, the image scales become different. Consequently, if the images are displayed with the magnification as it is, the pattern areas displayed become different as well.

Accordingly, in the electron microscope 100 according to the present embodiment, a processing which will be described below is executed to the photomask pattern image 301 as illustrated in FIG. 4, using another electron microscope and the control computer 209. This processing makes it possible to display the microscopic image 103 of the photomask pattern corresponding to the microscopic image 102 of the on-wafer pattern as illustrated in FIG. 1.

FIG. 5 is a flowchart for illustrating the manipulation processing step of manipulating the photomask pattern image 301 by the control computer 209, together with photomask pattern images in the processes.

At first, at a step 405, data on the photomask pattern image 301 are grabbed onto the control computer 209 from the memory device 210 via the input unit 209d (or from another memory device or another electron microscope connected to the network 212 via the I/O 209f), then being stored into the RAM 209c temporarily. At this time, magnification information on the electron microscope at the time when the photomask pattern image data has been acquired is grabbed together therewith, then being stored into the RAM 209c.

Next, the processing step proceeds to a step 406. Here, in order to display the photomask pattern image 301 in a manner of being reversed in the right-to-left direction, the data on the image 301 stored into the RAM 209c are manipulated. Since the image data are a collection of the intensity distribution data based on a regular arrangement relative to the positions, it is easy to reverse the image 301. At this point-in-time, display magnification of data on an image 402 implemented after the reversion remains the same as the electron microscope magnification (which is set at 40000-fold, here) at the time when the image 301 has been acquired.

At a step 407 subsequent thereto, the magnification of the photomask pattern image is modified in order to display the on-wafer pattern image and the photomask pattern image at the same scale. For example, assume that the image acquisition magnification of the on-wafer pattern image is equal to 200000-fold, and that the reduction ratio at the time when the pattern is transferred onto the wafer by the microlithography tool is equal to 1/fourth. In this case, in order to display the on-wafer pattern image and the photomask pattern image at the same scale on the display screen 101, the image data on the photomask pattern is modified (reduced) into image data which corresponds to the image acquired with a 50000-fold acquisition magnification. The area surrounded by a dot line on an image 403 corresponds to the photomask pattern image after the scale modification. Since the image data are a collection of the intensity distribution data based on a regular arrangement relative to the positions, the scale modification processing for this image is also implementable by re-calculating the image data by, e.g., interpolation computation. Incidentally, this step 407 may be exchanged with the step 406 in their order.

Moreover, finally, at a step 408, as illustrated in FIG. 1, the 50000-fold image 103 of the photomask pattern which has been scaled-modified is displayed together with the 200000-fold image 102 of the on-wafer pattern under the same display condition (i.e., at the same scale and is directed into the same direction) on the display screen 101 of the display device 110. The control computer 209 executes the above-described processing steps repeatedly every time the display target location is changed.

Incidentally, although omitted in FIG. 5, if a shift exists between the display angles of the image 102 and the image 103, a processing for causing the display angles of the image 102 and the image 103 to coincide with each other by rotating the image 103 may be executed depending on the requirements. Of course, regarding this processing as well, not being limited to the case where the image 103 is manipulated with the image 102 selected as the reference, the image 102 may be rotated with the image 103 selected as the reference. Otherwise, the display angles of both of the images may be caused to coincide with each other by rotating both in the opposite directions.

As having explained hereinbefore, according to the present embodiment, when abnormalities have been found out on the on-wafer pattern, it becomes possible to judge, at the time of the measurement, whether the abnormalities are caused by the photomask formation such as the CD or shape of the photomask, or the abnormalities are caused by inappropriateness of the OPC or the wafer fabrication process. This judgment is made possible by making the comparison and contrast between the microscopic images of the corresponding locations of the photomask pattern and the on-wafer pattern.

Consequently, in comparison with the conventional methods where the problems of the photomask and the fabrication process are investigated after the on-wafer pattern image alone has been acquired once, it becomes possible to tremendously speed up confirmation of where the causes for the found-out pattern abnormalities exist in. This makes a significant contribution to a reduction in the number of the processing steps for semiconductor fabrication.

Incidentally, in the present embodiment, the image acquisition magnification of the photomask pattern is set at 40000, and the image acquisition magnification of the on-wafer pattern is set at 200000. If, however, the image magnification of the on-wafer pattern is set at 50000 in advance, the processing step of modifying the magnification is unnecessary. For this purpose, the image magnification of the on-wafer pattern is determined beforehand, and the photomask pattern image is acquired with the reduction exposure magnification thereof (1/fourth-fold in the present embodiment). Namely, it is also conceivable that the acquisition magnifications of the microscopic images of the photomask pattern and the on-wafer pattern be set in advance so that both of the microscopic images will be displayed at the same scale. Also, when measuring the microscopic image of the photomask pattern after reversing the photomask pattern beforehand, or when grabbing the microscopic image of the photomask pattern whose reversion processing has been performed in advance, the processing step of reversing the image is also made unnecessary. In this case, the processing step of manipulating the image is omitted from the program stored into the ROM 209*b*. Namely, it is conceivable that the program is simplified into a program for causing the control computer 209 to execute a processing step of creating, based on both of the image data, a display signal for simply displaying at the same scale the microscopic image acquired by another electron microscope and the microscopic image acquired by the present electron microscope itself, and to execute a processing step of outputting the computed display signal to the display device 110. Also, it is possible to make a quantitative comparison between the on-wafer pattern image and the photomask pattern image by making dimension measurements of them each.

(2nd Embodiment)

In the length-measuring SEM, there exists a method of determining a length-measuring position with CAD pattern data, i.e., design data on the on-wafer pattern, employed as the reference. In this method, a comparison is made between the CAD data and the pattern image acquired by the length-measuring SEM, then making the pass/fail judgment based on data on the dimension difference with the CAD data. The format for the CAD pattern data is GDSII format or OASIS format. In these data formats, a pattern and its position are defined by a polygon whose dimension is substantially equal to that of the on-wafer pattern. Taking advantage of the CAD data in this way makes it unnecessary to register the image data on a length-measuring pattern itself at the time of length measurement. Accordingly, it becomes possible to shorten a time for determining the measurement condition and measurement processing step if the length measurement of the same pattern is not made at a plurality of times.

In the present embodiment, if a problem exists in the dimension and shape of the on-wafer pattern acquired by the electron microscope according to the present invention, the photomask pattern based on which the on-wafer pattern is formed is displayed on the display screen 101 in accordance with the processing steps explained in the first embodiment. After that, in order to judge whether or not an abnormality exists on the photomask pattern, CAD pattern data used for the photomask design, i.e., original pattern shape (e.g., visible outline) intended at the design, is displayed in a manner of being superposed on the photomask pattern image.

Here, the CAD data on the photomask pattern used in the electron microscope according to the present invention is created as follows: Data obtained by adding the OPC pattern to the CAD data on the on-wafer pattern is reversed, then being magnified by a reduction ratio of the microlithography tool. In this processing, which is referred to as "mask data conversion", the data after being converted is further converted into a format readable into the photomask-pattern drawing device. In order to convert this mask data into the CAD data of GDSII format or OASIS format again, using mask-data-conversion tool software used for the mask data conversion will suffice.

FIG. 6 is a diagram for illustrating an example of the display screen of the electron microscope according to a second embodiment of the present invention.

The present embodiment is an embodiment where the CAD data is displayed in a manner of being superposed on the display screen 101 of the electron microscope in the first embodiment illustrated in FIG. 1 earlier. In FIG. 6, a pattern outer-shape 501 based on the CAD data is displayed within the image 102 of the on-wafer pattern. Also, a pattern outer-shape 502 based on the CAD data which is mask-data converted or converted again is displayed within the image 103 of the photomask pattern. The CAD data on the on-wafer pattern and the CAD data on the photomask pattern may be directly grabbed into the control computer 209 via the network 212, the I/O 209*f*, or a storage medium such as removable disc or flexible disc from a computer (not illustrated) which has created the CAD data or a memory device (not illustrated) which stores the CAD data. Otherwise, after being grabbed in this way, the CAD data may be stored into the memory device 210 or the memory 209*h*, and may be read when required.

The display processing steps for the pattern outer-shape 501 of the on-wafer pattern and the pattern outer-shape 502 of the photomask pattern onto the image 102 and the image 103 are performed in accordance with basically the same processing steps as the display of the pattern image in the first embodiment. Namely, e.g., in the case of manipulating the photomask pattern image in coincidence with the on-wafer pattern image, the display condition of the on-wafer pattern becomes the reference. Accordingly, the control computer 209 computes a display signal on the basis of the CAD data on the on-wafer pattern so that the CAD outer-shape line of the same portion as the on-wafer pattern image to be displayed will be displayed at the same scale as the on-wafer pattern image. Then, the control computer 209 outputs the display signal to the display device 110, thereby causing the display device 110 to display the pattern outer-shape 501 such that the pattern outer-shape 501 is superposed on the image 102 within the display screen 101. Similarly, the control computer 209 computes a display signal on the basis of the CAD data on the photomask pattern so that the CAD outer-shape line of the same portion (i.e., the same portion as the on-wafer pattern image to be displayed) as the photomask pattern image to be displayed will be displayed at the same scale as the photomask pattern image. Then, the control computer 209 outputs the display signal to the display device 110, thereby causing the display device 110 to display the pattern outer-shape 502 such that the pattern outer-shape 502 is superposed on the image 103 within the display screen 101.

In this case, when computing the display signals of the pattern outer-shapes 501 and 502, based on the CAD data on both of the patterns, display magnifications of the pattern outer-shapes to be displayed are modified depending on the requirements by executing processing steps in compliance with the processing steps in the first embodiment. Also, in particular, if the pattern outer-shape 502 of the photomask pattern is in a reversed state relative to the on-wafer pattern at the point-in-time when the pattern outer-shape 502 has been read into the control computer 209, a reversion processing is applied thereto on the basis of the CAD data on the photomask pattern by executing the processing steps in compliance with the processing steps in the first embodiment. At this time, if a shift exists between display angle of the image 102 and 103 and display angle of the pattern outer-shapes 501 and 502, a processing for causing the display angles to coincide with each other by rotating the pattern outer-shapes 501 and 502 may be executed depending on the requirements.

FIG. 7 is a diagram for exemplifying the display screen which displays an on-wafer pattern whose abnormality has been found out.

FIG. 7 illustrates the following case: On the image 102 of the on-wafer pattern, the patterns are short-circuited with each other via a connection 601, and there exists a possibility that the semiconductor circuit may result in an electrical short circuit in this portion. At this time, it is assumed that, as a result of seeing the corresponding location of the image 103 of the photomask pattern, an OPC-pattern portion 602 of the photomask pattern which is actually measured is formed larger as compared with the pattern outer-shape 502 of the photomask pattern. In this case, by superimposing the CAD data on the photomask pattern image thereby to make the comparison and contrast therebetween, it becomes possible to easily judge at a glance that the occurrence cause for the abnormality location of the on-wafer pattern exists in formation of the photomask. Also, if it can be judged that, at the abnormality location of the on-wafer pattern, the photomask pattern is normal even if the photomask pattern is compared with the CAD data as illustrated on the image 103 in FIG. 6, it can be judged on the spot that the occurrence cause for the abnormality exists in a factor other than the formation of the photomask, such as the wafer process.

Namely, even if only the microscopic image of the on-wafer pattern is displayed in such a manner that the microscopic image is superposed on the CAD data, what is recognizable is, after all, only the connection of the two patterns. Namely, the display like this has been insufficient to judge which of the wafer process and the photomask the occurrence cause for the defect exists in. In contrast thereto, in the present embodiment, the pattern image of the defect found out on the on-wafer pattern is displayed in such a manner that the comparison and contrast can be made between the pattern image and the photomask pattern image of the corresponding location. Simultaneously, the photomask pattern image and the CAD data thereof are superposed on each other. This feature makes it possible to easily recognize, at the time of the measurement, whether or not the abnormality lies in the formation of the photomask. Consequently, in addition to an effect similar to the one in the first embodiment, it becomes possible to judge more effectively where the cause for the pattern abnormality exists.

(3rd Embodiment)

The present embodiment relates to a concrete method for implementing, in the embodiments described hereinbefore, a common management of the pattern information acquired by another electron microscope and the pattern information acquired by the present electron microscope itself. Namely, the photomask pattern image is made related with the data and the CAD data in advance. As a result of this, when an abnormality location is found out at the time of evaluation of the on-wafer pattern, it is made possible to display the photomask pattern image and the CAD pattern outer-shape of the corresponding location with an excellent efficiency. This allows accomplishment of an even higher efficiency in investigating the occurrence causes. The present embodiment is particularly effective when evaluation points on the on-wafer pattern increase in number.

First, what is needed as information is the recognition of the photomask by which an on-wafer pattern is formed. For this purpose, identification displays, such as serial numbers or bar codes, are affixed onto the photomasks themselves or cases in which the photomasks are stored, thereby managing by which of the photomasks the on-wafer pattern is formed. Moreover, at the time of the CD measurement of the photomasks, the above-described identification display of the corresponding photomask is noted together onto the measurement result/measurement image data on the on-wafer pattern. The identification displays may be acquired along with the images, thereby obtaining data whose format is retrieval based on the image data of the identification displays. Then, the data may be stored along with the image information.

In the present embodiment, the common management of the pattern information to be measured is performed as the common management of the photomask pattern and the on-wafer pattern. This method is particularly easy to apply when, like hot spots, the CD evaluation points are determined in advance before the photomask fabrication. The identification displays, such as serial numbers, are affixed onto the measurement patterns, thereby making the management with the same identification displays even if the arrangement of the coordinate data is modified by the mask data conversion.

The common management of the pattern information to be measured is performed as the photomask pattern and the on-wafer pattern by, e.g., adding the identification display of the corresponding photomask to data file describing the wafer measurement condition and measurement order of respective patterns on the wafer according to the present electron microscope 100. On account of this, when an abnormality has been found out in the CD or shape of the on-wafer pattern, the microscopic image of the corresponding photomask pattern or data relating thereto can be immediately retrieved and read from the serial number (mask serial) of the photomask used for the transfer of the on-wafer pattern and the identification display of the pattern. This allows implementation of an enhancement in the display efficiency.

At this time, the microscopic image of the photomask pattern or the data relating thereto are transferred to the present electron microscope 100 via the network 212, then being memorized in advance into the memory device 210 or the memory 209h in a form of being made related with the identification display of the photomask and the pattern. Of course, the microscopic image of the photomask pattern or the data relating thereto may also be grabbed into the control computer 209 not via the network 212 but via a storage medium such as removable disc or flexible disc. Otherwise, not being limited to the case where the above-described data or the like are grabbed into the present electron microscope 100 in advance, the data or the like memorized into another electron microscope, computer, and memory device connected to the network 212 may be grabbed via the network 212 when required. In any case, it is possible to easily identify and acquire the corresponding data by retrieving the identification display of the photomask and the pattern.

FIG. 8 is a diagram for illustrating an example of the management data on the photomasks used in the present embodiment.

The management data on the photomasks illustrated in FIG. 8 (hereinafter, referred to as "mask CD information file") includes mask serial number 10, pattern serial number 20, pattern data (mask CAD data) by CAD data 30, in-mask coordinate data 40, CD measurement result 50 of the photomasks by the electron microscope, microscopic image (or image file name) 60 of the photomask pattern, and image magnification 70 of the photomask pattern. Filing these pieces of information in a manner of being made related with each other makes it possible to immediately display the corresponding photomask, pattern image, and CAD data at the time of acquiring (or after acquiring) the on-wafer pattern image.

In particular, in the mask CAD data 30, as illustrated in FIG. 8, the corresponding pattern portion is cut off in advance for each pattern identification-display basis, then adding each file name thereto individually. This makes it possible to easily extract the CAD data without saving the pattern file in large capacity. Also, concerning the mask CAD data and the microscopic images of the patterns having large data capacity, only the information on the file names and directory or the like memorizing the file names are memorized into the mask CD information file, thereby reducing the file capacity. This allows implementation of smoother communications via the network 212.

(4th Embodiment)

The present embodiment is an embodiment of a configuration where, in the control computer 209, a program for causing the computation unit 209a to execute the following processing is stored into the ROM 209b: Namely, in this processing, result of an optical lithography simulation performed based on the photomask pattern image is displayed such that the result is superposed on the on-wafer pattern image. The other configurations and operations are basically the same as the embodiments described hereinbefore. The processing step of displaying the optical lithography simulation result is carried out in compliance with the processing step of displaying the photomask pattern image in the first embodiment and the processing step of displaying the CAD data in the second embodiment.

In the case of the present embodiment, the program for the optical lithography simulation may be stored beforehand into the ROM 209b, and the optical lithography simulation may be executed by the computation unit 209a, then displaying the result on the display screen 101 or memorizing the result into the memory device 210 or the memory 209h. Otherwise, the optical lithography simulation may be executed by another appliance, and the optical lithography simulation result may be grabbed into the control computer 209 from the appliance or another memory device which has executed this optical lithography simulation. Regarding this data grabbing method, in addition to a method of acquiring the data via the network 212 and the I/O 209f, a method of acquiring the data via a storage medium is conceivable. Also, preferably, the data on the optical lithography simulation result is managed by being memorized into a data file (e.g., mask CD information file in FIG. 8) on the photomasks, or a data file made related therewith. This is the same procedure as the one where the photomask pattern image and the CAD data are memorized in the manner of being made related with the on-wafer pattern.

Namely, in the present embodiment, the simulation is performed as to what shape of pattern will be formed on the wafer if, based on the photomask pattern image, the photomask pattern is reduced, projected, and exposed onto the wafer. Then, a pattern's predicted shape which will be formed on the wafer is compared with an on-wafer pattern which is actually measured. In this way, by displaying the optical lithography simulation result such that the result is superposed on the on-wafer pattern image, it becomes possible to facilitate the judgment as to whether the occurrence cause for a pattern abnormality lies in the photomask or the wafer process.

Carrying out the optical lithography simulation based on the photomask pattern image requires that a light shielding portion and a light transmission portion of the mask pattern be determined from the photomask image. Since the photomask image is also data including positions and intensity information, it is possible to binarize the light shielding portion and the light transmission portion by determining a threshold value. Noise, however, is mixed into the image data. In order to eliminate this noise and carry out the optical lithography simulation without fail, preferably, the correlated computation is executed using the CAD data explained in the second embodiment and the threshold-value data, thereby determining boundary of the photomask pattern. The optical lithography simulation of the reduced projection and exposure is carried out based on the data created via the process like this.

FIG. 9 is a diagram for illustrating an example of the display screen of an electron microscope according to the fourth embodiment of the present invention.

As illustrated in FIG. 9, in the present embodiment, the result of the optical lithography simulation is displayed in a manner of being superposed on the on-wafer pattern image. The pattern outer-shapes 502 based on the CAD data which are mask-data converted or converted again are indicated by, e.g., doted lines within the image 103 of the photomask pattern. Then, mask pattern outer-shapes 801 computed based on the original photomask pattern image are displayed in a manner of being superposed on the pattern outer-shapes 502. Here, in a pattern which is the left-most within the image 103 of the photomask pattern, an OPC pattern at the upper-right portion is formed smaller as compared with the original CAD data.

Light shielding portions are formed with the mask pattern outer-shapes 801, and the optical lithography simulation results 802 (outer-shapes) of the reduced projection and exposure are indicated by, e.g., solid lines within the image 102 of the on-wafer pattern. In the example in FIG. 9, the simulation results 802 become substantially the same outer-shapes as the microscopic images (i.e., geometries dithered in black) of the on-wafer pattern. Namely, the example indicates the case where, despite the fact that validity is recognized in the simulation results, the microscopic image of a pattern which is the left-most within the image 102 is measured shorter as compared with the pattern outer-shape 501 based on the CAD data on the on-wafer pattern. In this case, it can be estimated that the wafer fabrication process or the like has been normal. Accordingly, it can be judged that the cause for the fact that the pattern which is the left-most within the image 103 becomes shorter as compared with the CAD data lies in the formation of the OPC pattern of the photomask pattern.

As having been described hereinbefore, the optical lithography simulation using the microscopic image of a photomask pattern is carried out with respect to a pattern whose abnormality has been found out on the wafer. Then, the comparison is made between the prediction of the on-wafer pattern shape and the actually-measured pattern shape. This makes it possible to judge whether or not the cause for the abnormality on the on-wafer pattern lies in the photomask pattern. Consequently, in addition to an effect similar to the one in the first embodiment, it becomes possible to judge more effectively where the cause for the pattern abnormality exists. Also, it is needless to say that a combination of the present embodiment and the second or third embodiment exhibits a synergistic effect.

Incidentally, in each embodiment described hereinbefore, the configuration has been employed where the microscopic image of the on-wafer pattern is measured by the electron microscope according to the present invention, and where the comparison and contrast is made with the microscopic image of the photomask pattern measured by another electron microscope. A configuration, however, is also conceivable where the microscopic image of the photomask pattern is measured by the electron microscope according to the present invention, and where the comparison and contrast is made with the microscopic image of the on-wafer pattern measured by another electron microscope. Also, the explanation has been given selecting, as the example, the case where the microscopic image measured by another electron microscope is manipulated with the microscopic image measured by the present electron microscope itself employed as the reference. Nevertheless, the microscopic image measured by the present electron microscope itself may be manipulated with the microscopic image measured by another electron microscope employed as the reference, or both of the microscopic images may be manipulated. These cases also allow acquisition of basically the same effect.

Also, the explanation has been given selecting, as the example, the display condition where the microscopic image of the photomask pattern and the microscopic image of the on-wafer pattern are displayed in a manner of being arranged side by side. Depending on the cases, however, both of the microscopic images may be displayed in a manner of being superposed on each other. In this case, it is preferable to display only the outer-shape lines of either or both of the microscopic images. This is because such a display makes it easy to confirm a difference between the shapes of both of the microscopic images. Furthermore, the explanation has been given selecting, as the example, the case where the present invention is applied to the scanning electron microscope (SEM). The present invention, however, is also applicable to another electron microscope such as transmission electron microscope, and basically the same effect can be obtained.

Also, the explanation has been given selecting, as the example, the case where the microscopic image acquired by the present electron microscope itself and the microscopic image acquired by another electron microscope are displayed, thereby making the comparison and contrast therebetween. The following configuration, however, is also conceivable: Both of the measurements of the on-wafer pattern and the photomask pattern are separately performed by the present electron microscope itself. Then, the microscopic image measured first is memorized into the memory device 210 (or, external memory device). Moreover, this microscopic image is displayed along with the microscopic image measured next, thereby making the comparison and contrast therebetween. In this case, basically the same effect can be obtained by executing basically the same processing steps as in each embodiment with the same procedure. Although the above-described description has been given in association with the embodiments, it is apparent for those who are skilled in the art that the present invention is not limited thereto, but can be modified and amended in various ways within the scope of the spirit of the present invention and the appended claims thereof.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An electron microscope, comprising:
an input unit for capturing image data on a microscopic image acquired by another electron microscope;
a memory unit for memorizing said image data on a pattern image of a photomask captured via said input unit;
a computation processing unit configured for:
manipulating said image data on said pattern image of a photomask memorized into said memory unit by executing at least an image-display-magnification modifying step and an image reversing step, in order that a display condition of the pattern image of the photomask and display condition of a pattern image on a wafer formed by using the photomask which is a microscopic image acquired by said electron microscope itself are caused to coincide with each other, and
generating a display signal based on said image data on said pattern image of the photomask manipulated by said computation processing unit and image data on said pattern image on the wafer; and
a display unit for displaying, based on said display signal from said computation processing unit, microscopic image manipulated by said computation processing unit and said pattern image on the wafer.

2. The electron microscope according to claim 1, wherein:
said computation processing unit further executes an image-rotation correcting step to at least one of said microscopic images in order that display conditions of both of said microscopic images are caused to coincide with each other.

3. The electron microscope according to claim 1, wherein:
said computation processing unit reduces said pattern image of said photomask based on a transfer magnification at a time when said pattern image on said wafer is formed using said photomask.

4. The electron microscope according to claim 1, wherein:
said computation processing unit manipulates computer aided design (CAD) data on said pattern image of said photomask, and causes said display unit to display a pattern outer-shape corresponding to said pattern image of said photomask such that said pattern outer-shape is superposed on said pattern image on said wafer.

5. The electron microscope according to claim 1, wherein:
said pattern image of the photomask and said pattern image on the wafer are managed in a manner of being made related with each other.

6. The electron microscope according to claim 1, wherein:
said computation processing unit causes said display unit to display a simulation result such that said simulation result is superposed on said pattern image on said wafer, said simulation result being based on said pattern image of said photomask of a pattern shape to be formed on said wafer when said photomask is used.

* * * * *